United States Patent [19]

Fujimura et al.

[11] Patent Number: 5,403,436
[45] Date of Patent: Apr. 4, 1995

[54] PLASMA TREATING METHOD USING HYDROGEN GAS

[75] Inventors: Shuzo Fujimura, Tokyo; Tetsuya Takeuchi, Koube; Takeshi Miyanaga, Ono; Yoshimasa Nakano, Akashi; Yuji Matoba, Koube, all of Japan

[73] Assignee: Fujitsu Limited, Kawasaki, Japan

[21] Appl. No.: 272,519

[22] Filed: Jul. 11, 1994

Related U.S. Application Data

[63] Continuation of Ser. No. 93,906, Jun. 30, 1993, abandoned, which is a continuation of Ser. No. 719,738, Jun. 25, 1991, abandoned.

[30] Foreign Application Priority Data

Jun. 26, 1990 [JP] Japan .................... 2-168905

[51] Int. Cl.⁶ .................... B05D 3/06; H01L 21/306
[52] U.S. Cl. ........................ 156/643; 156/646; 156/662; 156/664; 156/668; 427/534; 427/539; 427/536
[58] Field of Search ............... 427/525, 526, 535, 536, 427/534, 539; 156/643, 646, 662, 664, 668

[56] References Cited

U.S. PATENT DOCUMENTS

| | | | |
|---|---|---|---|
| 3,671,313 | 6/1972 | Reynolds | 427/534 |
| 4,521,274 | 6/1985 | Reichmannis et al. | 427/539 |
| 4,560,576 | 12/1985 | Lewis et al. | 427/534 |
| 4,683,024 | 7/1987 | Miller et al. | 427/534 |
| 4,933,060 | 6/1990 | Prohaska et al. | 156/643 |
| 4,961,820 | 10/1990 | Shinagawa et al. | 156/643 |
| 4,980,021 | 12/1990 | Kitamura et al. | 427/38 |
| 5,135,775 | 8/1992 | Foller et al. | 427/535 |
| 5,279,705 | 1/1994 | Tanaka | 156/662 |
| 5,294,568 | 3/1994 | McNeilly et al. | 156/646 |

FOREIGN PATENT DOCUMENTS 62-154627 7/1987 Japan .
1-192119 8/1989 Japan .

OTHER PUBLICATIONS

Patent Abstracts of Japan, vol. 4, No. 170 (E-35) (652) 22 Nov. 1980, and JP-A-55 117244 Kobayashi.
Patent Abstracts of Japan, vol. 13, No. 402 (C-633) 06 Sep. 1989, and JP-A-01 145396 Takeuchi.
"Low-Temperature Surface Cleaning Method Using Low-Energy Reactive Ionized Species", Yamada, J. Appl. Phys. 65 (2), Jan. 15, 1989, pp. 775–781.
Patent Abstracts of Japan, vol. 10, No. 355 (C-388) 29 Nov. 1986, and JP-A-61 153277 Toyoshima Yasutake.
Patent Abstracts of Japan, vol. 7, No. 190 (E-194) (1335) 19 Aug. 1983, and JP-A-58 093251 Hazuki.
Patent Abstracts of Japan, vol. 14, No. 194 (E-919) 20 Apr. 1990, and JP-A-02 039524 Zenichi.
Patent Abstracts of Japan, vol. 9, No. 160 (C-289) 04 Jul. 1985, and JP-A-60 033300 Nobuaki.
Patent Abstracts of Japan, vol. 13, No. 352 (E-801) (3700) 08 Aug. 1989, and JP-A-01 112734 Yano.
Patent Abstracts of Japan, vol. 3, No. 82 (E-123) 14 Jul. 1979, and JP-A-54 059881 Moritaka.
Patent Abstracts of Japan, vol. 13, No. 509 (E-846) 15 Nov. 1989, and JP-A-01 206624 Yuko.
"Removal of a Thin $SiO_2$ Layer by Low-Energy Hydrogen Ion Bombardment at Elevated Temperature, Kiyoshi Miyake, Japanese Journal of Applied Physics", vol. 28, No. 11, Nov. 1989, pp. 2376–2381.
"Ashing of Ion-Implanted Resist Layer", Japanese Journal of Applied Physics, vol. 28, No. 10, Oct. 1989, pp. 2130–2136, Fujimura et al.

*Primary Examiner*—Marianne Padgett
*Attorney, Agent, or Firm*—Armstrong, Westerman, Hattori, McLeland & Naughton

[57] ABSTRACT

A plasma treating method subjects an object surface to a plasma treating within a chamber. First, first and second gasses are supplied into the chamber, where the first gas includes hydrogen molecules as a main component, the second gas includes a quantity of hydrogen less than that included in the first gas and is selected from a group of materials consisting of organic compounds and inorganic compounds, the organic compounds include hydrogen and oxygen and the inorganic compounds include hydrogen. Second, plasma of a mixed gas which is made up of the first and second gasses is generated within the chamber to subject the object surface to the plasma treating. Preferably, the second gas is water vapor.

12 Claims, 10 Drawing Sheets

FIG.IA
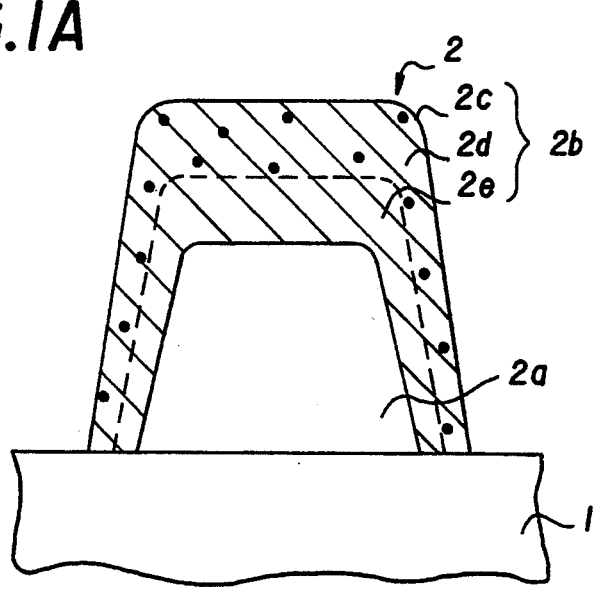
FIG.IB
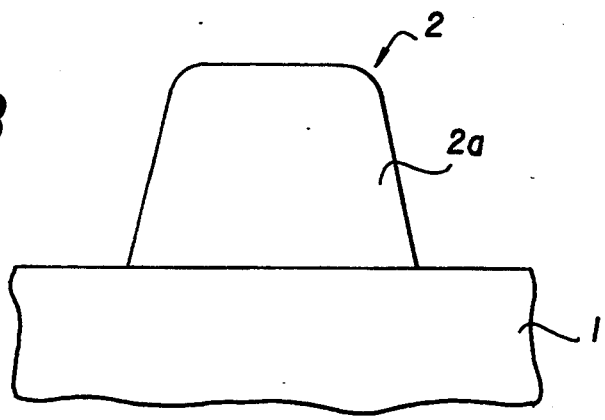
FIG.IC
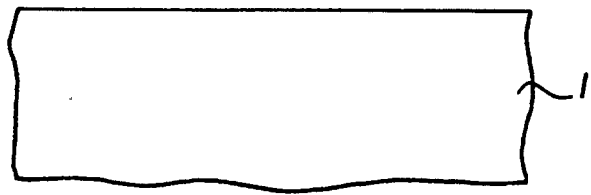

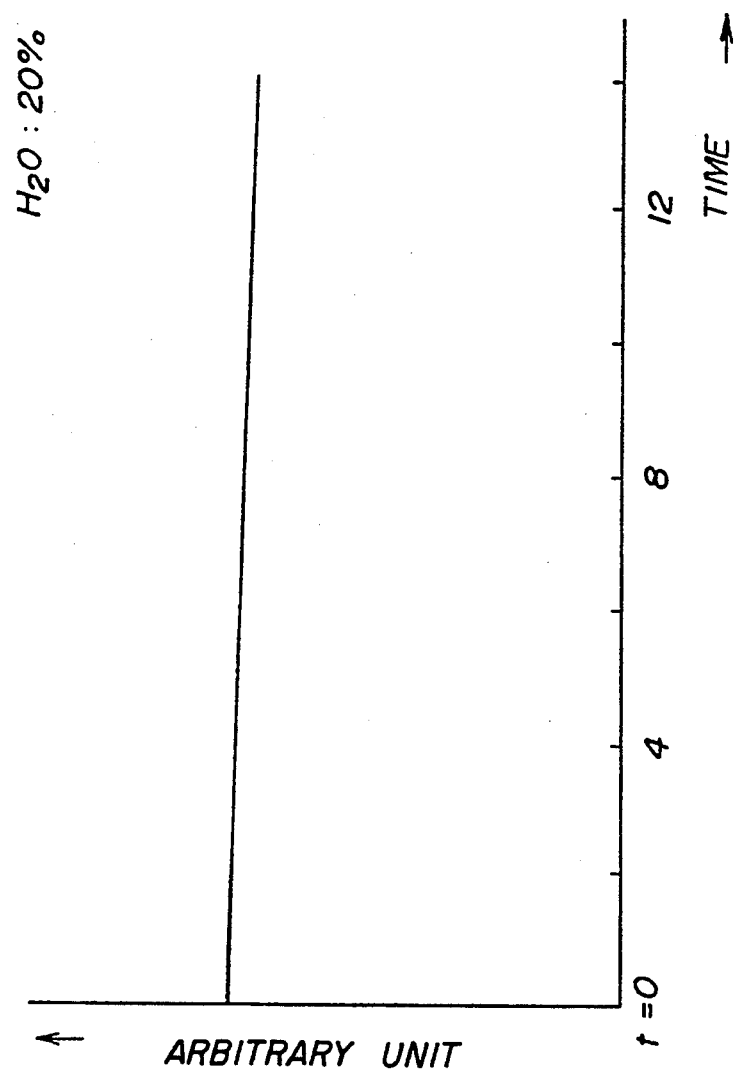

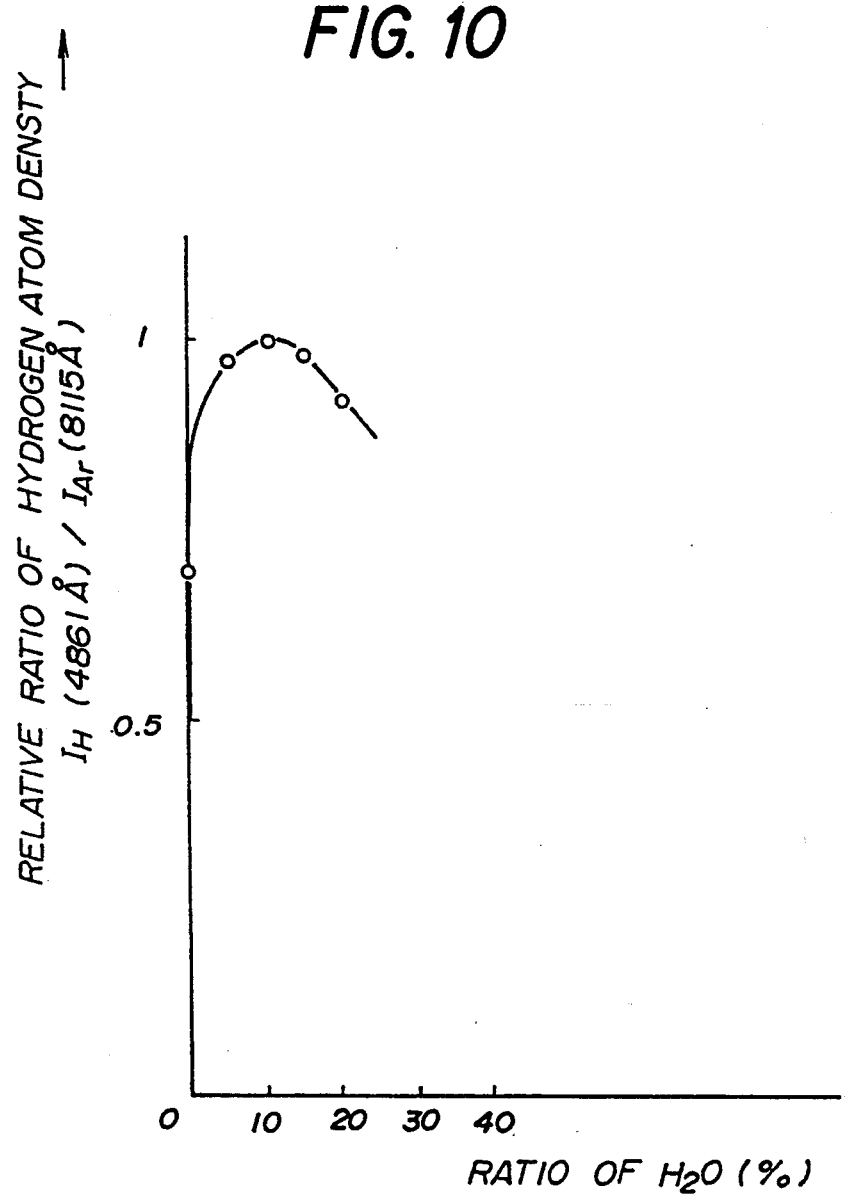

PLASMA TREATING METHOD USING HYDROGEN GAS

This application is a continuation of application Ser. No. 08/093,906, filed Jun. 30, 1993, which is a continuation of application Ser. No. 07/719,738, filed Jun. 25, 1991, both now abandoned.

BACKGROUND OF THE INVENTION

The present invention generally relates to plasma treating methods, and more particularly to a plasma treating method which uses a hydrogen gas.

Various proposals have been made to carry out a plasma treating of a solid surface using a gas which includes hydrogen. For example, Fujimura et al., Procedures of The Symposium on Dry Process, Edited by Nishizawa et al., PV 88-7, The Electromechanical Society, Inc. 1988, pp. 126–133 proposes a method of removing a resist layer which is used as a mask during an ion implantation. On the other hand, K. Miyake, "Removal of a Thin $SiO_2$ Layer by Low-Energy Hydrogen Ion Bombardment at Elevated Temperatures", Japanese Journal of Applied Physics, Vol. 28, No. 11, November, 1989, pp. 2376–2381 proposes a method of cleaning a silicon surface using hydrogen ions drawn out from the plasma. The present invention relates to a plasma treating method which uses a hydrogen gas and is applicable to the proposed methods described above.

For example, when using hydrogen in a pre-process which is carried out before epitaxially growing a layer on a silicon substrate, this pre-process is generally carried out by heating the substrate to a high temperature within a hydrogen atmosphere. Because the process uses a large quantity of hydrogen, the hydrogen is, for safety reasons, usually diluted by a gas such as nitrogen gas and argon gas which do not react with hydrogen. The pre-process using the hydrogen is carried out mainly for the purpose of removing a natural oxide layer which is formed on the silicon substrate, for example. Safety precautions must be taken during this pre-process, because the substrate temperature is raised to a high temperature on the order of 1000° C. and the hydrogen gas is supplied at a rate of 10 to 1000 liters/minute.

Hence, M. Miyake referred above proposes the plasma treating which can be carried out at a relatively low temperature, with an improved safety and high efficiency. In addition, Fujimura et al. referred above proposes the use of hydrogen plasma to remove ion implanted resist.

According to the conventional plasma treating methods which use hydrogen, the hydrogen gas itself is used, or a hydrogen gas which is diluted by an inert gas or nitrogen gas is used. However, there is a problem in that the ashing rate is poor and the process takes too long a time for practical purposes.

The main object of the plasma treating is to utilize hydrogen ions ($H^+$) and hydrogen radicals (hydrogen atoms H). For this reason, it is possible to employ an electron cycrotron resonance (ECR) plasma in order to improve the dissociation of the hydrogen and increase the speed of the process. However, it still takes a relatively long time to carry out the process and the use of the ECR plasma is still unsatisfactory for practical purposes.

SUMMARY OF THE INVENTION

Accordingly, it is a general object of the present invention to provide a novel and useful plasma treating method in which the problems described above are eliminated.

Another object of the present invention is to provide a plasma treating method for subjecting an object surface to a plasma treating within a chamber, comprising the steps of (a) supplying first and second gasses into the chamber, where the first gas includes hydrogen molecules as a main component, the second gas includes a quantity of hydrogen less than that included in the first gas and is selected from a group of materials consisting of organic compounds and inorganic compounds, the organic compounds include hydrogen and oxygen and the inorganic compounds include hydrogen, and (b) generating within the chamber plasma of a mixed gas which is made up of the first and second gasses to subject the object surface to the plasma treating. According to the plasma treating method of the present invention, it is possible to considerably increase the speed of processes which use hydrogen atoms and hydrogen ions.

Other objects and further features of the present invention will be apparent from the following detailed description when read in conjunction with the accompanying drawings.

BRIEF DESCRIPTION OF THE DRAWINGS

FIGS. 1A, 1B and 1C are cross sectional views for explaining a first embodiment of a plasma treating method according to the present invention;

FIG. 9 shows the quantity change of hydrogen atoms with time when the hydrogen plasma process is carried out using hydrogen gas added with water vapor; and FIG. 10 shows the density of hydrogen atoms depending on the quantity of water vapor added to the hydrogen gas when carrying out the hydrogen plasma process.

DESCRIPTION OF THE PREFERRED EMBODIMENTS

Figure 2:
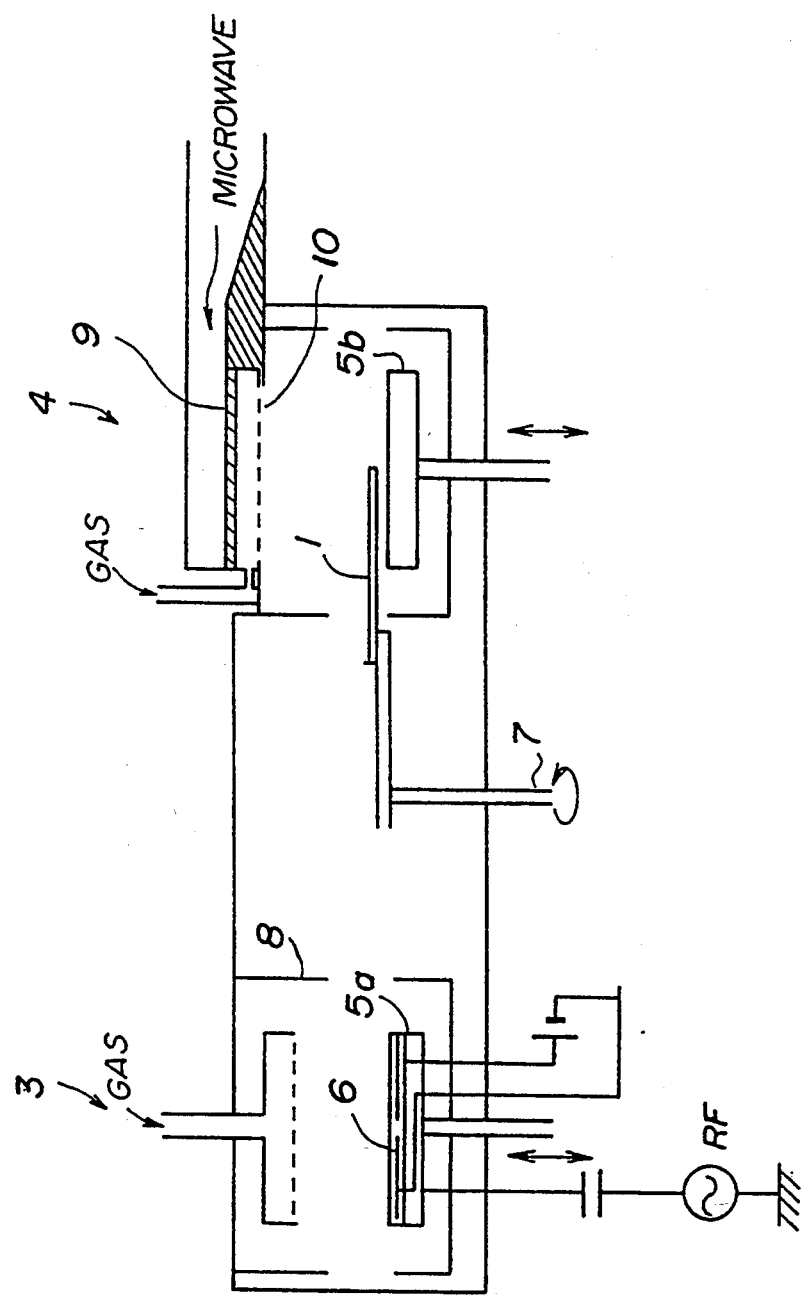
FIG. 2 is a cross sectional view generally showing a plasma treating apparatus used in the first embodiment.

A description will be given of a first embodiment of a plasma treating method according to the present invention, by referring to FIGS. 1 through 4. In this embodiment, the present invention is applied to a resist removing process.

As shown in FIG. 1A, a resist layer 2 is formed on a 6-inch diameter silicon (Si) substrate 1 by coating approximately 1 μm of novolac resin system resist such as the resist OFPR8600A manufactured by Tokyo Ohka Kogyo of Japan. The substrate 1 coated with the resist layer 2 is baked on a hot plate for 90 seconds at 90° C., and thereafter, P+ ions are implanted with a dosage of $1 \times 10^{16}$ atoms/cm² at 70 KeV. By this ion implantation, a deteriorated layer 2b having a thickness on the order of 2300 Å covers a non-deteriorated layer 2a of the resist layer 2. This deteriorated layer 2b is made up of a cross contaminated layer 2c, an injection carbonization layer 2d and a secondary carbonization layer 2e. The formation of the deteriorated layer 2b is reported in Fujimura et al., "Ashing of Ion-Implanted Resist Layer", Japanese Journal of Applied Physics, Vol. 28, No. 10, October 1989, pp. 2130–2136.

Next, a reactive ion etching (RIE) module 3 of the plasma treating apparatus shown in FIG. 2 is used to remove the deteriorated layer 2b by hydrogen plasma as shown in FIG. 1B, and a downstream module 4 of the plasma treating apparatus is thereafter used to remove the remaining non-deteriorated layer 2a by a downstream ashing so as not to damage the substrate 1.

The RIE module 3 generally includes a substrate stage 5a on which the substrate 1 is placed and a heater 6 provided within the stage 5a, and the stage 5a is provided within a plasma chamber 8. On the other hand, the downstream module 4 generally includes a stage 5b, a quartz window 9 and a shower-head 10. An arm 7 rotates in the direction of an arrow to move the substrate 1 from the RIE module 3 to the downstream module 4. When moving the substrate 1 from the RIE module 3, pins (not shown) of the stage 5a lift up the substrate 1 so that the arm 7 can carry the substrate 1 to the downstream module 4. At the downstream module 4, pins (not shown) of the stage 5b receive the substrate 1 and then lower the substrate 1 in position on the stage 5b.

If oxygen plasma is used to remove the deteriorated layer 2b, the injected material is oxidized and remains as an oxide. Accordingly, it is desirable to use a gas which does not include oxygen so that the effects caused by the oxygen is negligible even when the Si of the deteriorated layer 2b includes oxygen. In other words, it is necessary to use a gas which results in a process approximately the same as that obtained when only hydrogen gas is used.

The hydrogen plasma process, that is, the RIE process, is carried out by supplying hydrogen gas to the plasma chamber 8 shown in FIG. 2 at a rate of 500 cc/minute, and exciting hydrogen using a high-frequency wave of 13.56 MHz with a power of 450 W at 1 Torr so as to generate the hydrogen plasma. The structure shown in FIG. 1A is subjected to this hydrogen plasma process in the RIE module 3. In addition, the downstream process is carried out in the downstream module 4 by supplying oxygen ($O_2$) gas at a rate of 600 cc/minute, supplying water ($H_2O$) at a rate of 400 cc/minute, using a microwave of 2.45 GHz with a power of 1 kW at 1 Torr, and setting the temperature of the stage 5b to 200° C.

When the hydrogen plasma process is insufficient, the deteriorated layer 2b remains and this remaining deteriorated layer 2b cracks and is scattered as unwanted contamination particles during the downstream process due to the expansion of the non-deteriorated layer 2a when the substrate 1 is heated. In most cases, the contamination particles cannot be removed completely during the downstream ashing, and the contamination remains on the substrate 1. Accordingly, it is possible to judge whether or not the hydrogen plasma process is sufficient by determining whether or not the deteriorated layer 2b cracks during the downstream process and whether or not the contamination of the deteriorated layer 2b remains on the substrate 1.

A minimum time required for the hydrogen plasma process to be carried out in order to completely remove the deteriorated layer 2b of the resist layer 2 was approximately 7 minutes. Next, when the hydrogen plasma process was carried out at an increased pressure of approximately 2 Torr, it took approximately 10 minutes to completely remove the deteriorated layer 2b.

On the other hand, this embodiment was carried out under first and second conditions described hereunder. Under the first condition, the hydrogen plasma process was carried out by modifying the supply of the hydrogen gas to a rate of 425 cc/minute, the supply of water vapor to a rate of 75 cc/minute and the pressure to 1 Torr. In this case, the minimum time required to completely remove the deteriorated layer 2b of the resist layer 2 was approximately 90 seconds. Under the second condition, the hydrogen plasma process was carried out by modifying the supply of the hydrogen gas to a rate of 475 cc/minute, the supply of water vapor to a rate of 25 cc/minute and the pressure to 2 Torr. In this case, the minimum time required to completely remove the deteriorated layer 2b of the resist layer 2 was approximately 105 seconds.

Next, the hydrogen plasma process was carried out with respect to a resist layer 2 which has a pattern such that the resist layer 2 occupies ½ the area on the substrate 1. Under one condition, the hydrogen plasma process was carried out by supplying the hydrogen gas at a rate of 450 cc/minute, supplying the water vapor at a rate of 75 cc/minute and setting the pressure to 1 Torr. In this case, the minimum time required to completely remove the deteriorated layer 2b of this resist layer 2 was approximately 75 seconds. Under another condition, the hydrogen plasma process was carried out by supplying the hydrogen gas at a rate of 475 cc/minute, supplying the water vapor at a rate of 25 cc/minute and setting the pressure to 2 Torr. In this case, the minimum time required to completely remove the deteriorated layer 2b of the resist layer 2 was approximately 105 seconds. As a result, it may be regarded that the process speed of the hydrogen plasma process has little dependency on the pattern area of the resist layer 2.

Figure 3:
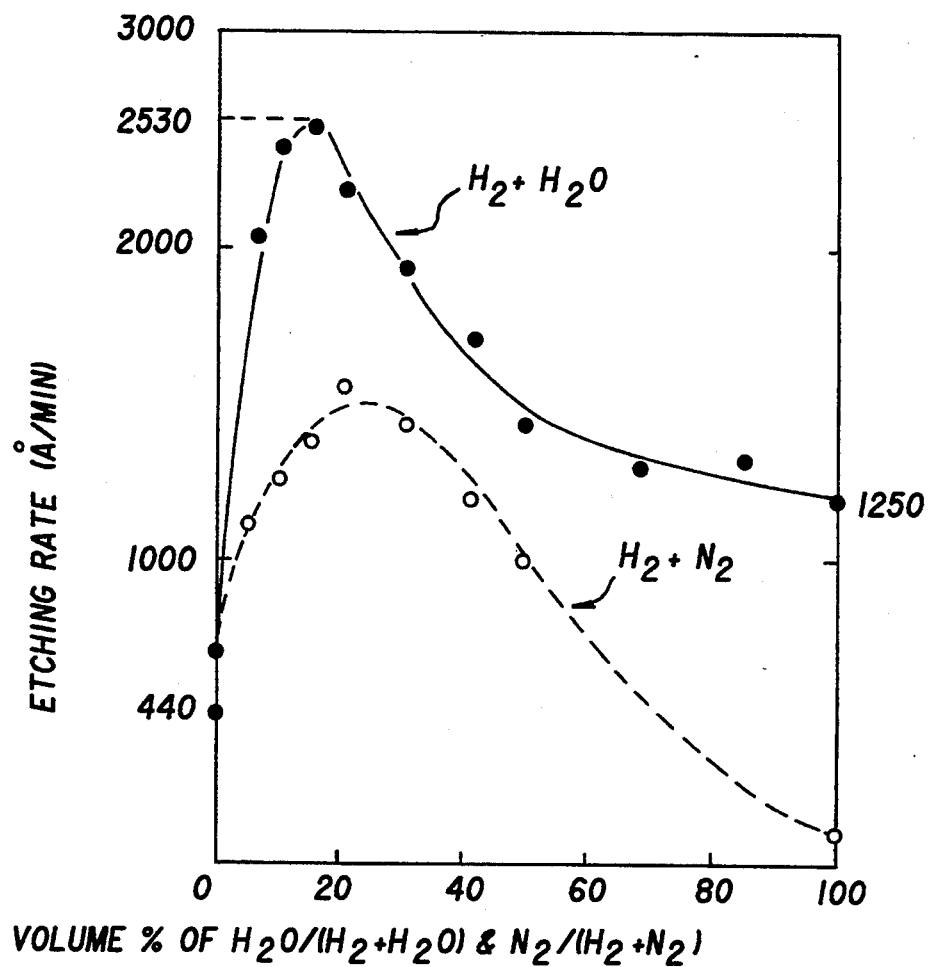
FIG. 3 is a diagram showing an etching rate versus ratio of gas added to hydrogen gas, for explaining the effects of the first embodiment.

In order to observe the effects of adding the water vapor to the hydrogen gas in this embodiment, the etching rate of a resist layer which has not been subjected to an ion implantation was observed as indicated by a solid line in FIG. 3. The resist layer used was coated on the entire surface of the substrate and baked at 200° C. for one minute, and the RIE was carried out at a pressure of 1 Torr with a microwave power of 1 kW. FIG. 3 also shows the etching rate of the resist layer using the hydrogen gas which is added with nitrogen gas, as indicated by a dotted line. As may be seen from FIG. 3, when the added water vapor is such that a ratio $H_2O/(H_2+H_2O)$ of the water vapor is approximately 10%, the etching rate increases to approximately five times that obtainable when no water vapor is added to the hydrogen gas. On the other hand, the etching rate decreases when the ratio of the water vapor exceeds 20%. The etching rate is approximately constant when the ratio of the water vapor is greater than 50%, and in this case, the etching rate is approximately ½ the maximum etching rate shown in FIG. 3. The data shown in FIG. 3 were obtained using the RIE module 3 shown in FIG. 2.

In addition, the color of the plasma was bluish pink when the ratio of the water vapor is 50 to 100%, while the color of the plasma was pink when the ratio of the water vapor is 0 to 30%. Hence, it was presumed that the hydrogen plasma process becomes approximately the same as an RIE process using 100% water vapor when the ratio of the water vapor is 50 to 100%, and the hydrogen plasma process becomes approximately the same as the RIE process using 100% hydrogen gas when the ratio of the water vapor is 0 to 30%. In other words, when ratio of the water vapor added to the hydrogen gas is 30% or less but greater than 0, the etching rate of the hydrogen plasma process can be increased to approximately five time that of the hydrogen plasma process using hydrogen gas alone.

As may be seen from FIG. 3, the sputtering effect of the nitrogen is obtainable when the nitrogen gas is added to the hydrogen gas because nitrogen is heavier than hydrogen. However, the etching rate does not increase over approximately two times the etching rate obtainable when the hydrogen plasma process uses the hydrogen gas alone.

Although not shown in FIG. 3, the etching rate did not change greatly from that indicated by the dotted line even when argon gas was added to the hydrogen gas when carrying out the hydrogen plasma process.

Next, a description will be given of a second embodiment of the plasma treating method according to the present invention. In this embodiment, a silicon dioxide (SiO$_2$) layer having a thickness of 200 Å is formed on a (100) face of a p-type single crystal substrate. As$^+$ ions were implanted into the substrate via the SiO$_2$ layer with a dosage of $4 \times 10^{15}$ atoms/cm$^2$ at a power of 70 keV. After removing the SiO$_2$ layer, the hydrogen plasma process was carried out. Then, an annealing process was carried out at 1000° C. for 30 minutes in a nitrogen atmosphere.

Figure 4:
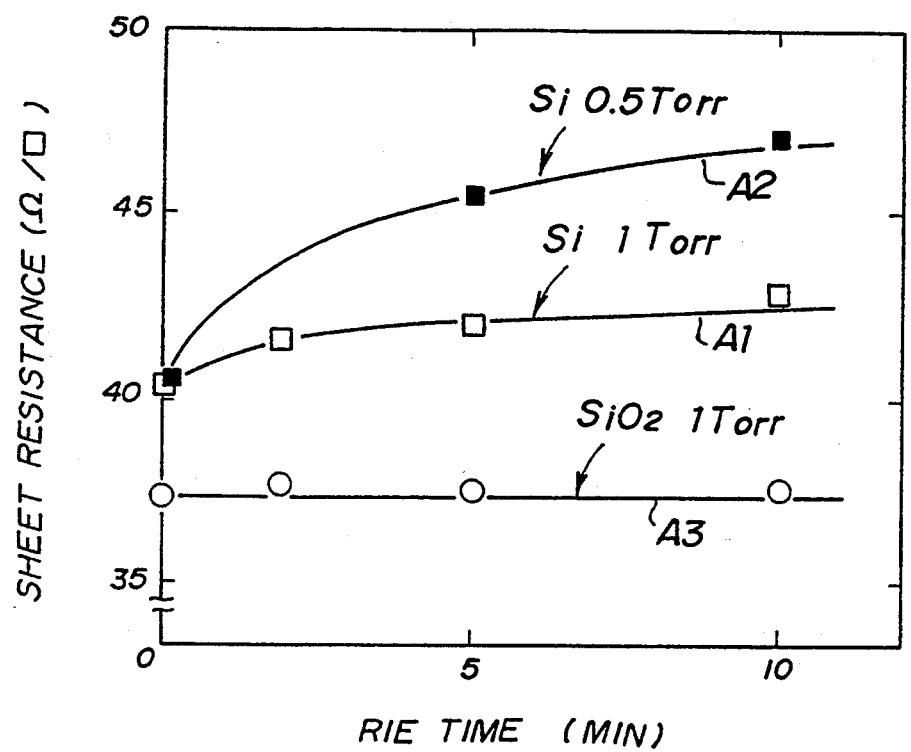
FIG. 4 is a diagram showing a sheet resistance versus RIE process time for explaining the effects of a second embodiment of the plasma treating method according to the present invention.

When the pressure during the hydrogen plasma process (that is, the RIE process) was varied and the sheet resistance was examined, it was found that the sheet resistance decreases when the pressure is increased from 0.5 Torr to 1 Torr. In FIG. 4, a curve A1 shows the sheet resistance at 1 Torr and a curve A2 shows the sheet resistance at 0.5 Torr. In addition, a curve A3 shows the sheet resistance for the case where the hydrogen plasma process was carried out without removing the SiO$_2$ layer, and in this case, the sheet resistance was virtually constant. Hence, the As within the Si escapes and the resistance increases when the pressure is less than 1 Torr, but it is possible to prevent the As within the Si from escaping and thus prevent the resistance from increasing when the pressure is 1 Torr or greater. In addition, when the area effect is considered, the desirable pressure is 1.8 Torr or greater because the area effect can be suppressed in this case.

Next, a description will be given of a third embodiment of the plasma treating method according to the present invention.

When epitaxially growing a Si layer on a Si substrate, there is a need to remove a natural oxide layer and contaminating materials such as carbon on the surface of the Si substrate. This embodiment removes such natural oxide layer and contaminating materials using apparatuses shown in FIGS. 5A and 5B.

Figure 5A:
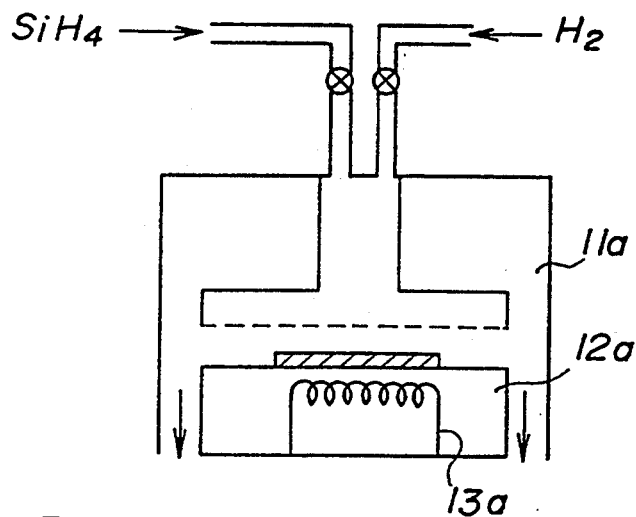
FIGS. 5A and 5B respectively are cross sectional views generally showing apparatuses used in a third embodiment of the plasma treating method according to the present invention.

FIG. 5A shows an epitaxial growth apparatus including a chamber 11$a$, a stage 12$a$ and a heater 13$a$. On the other hand, FIG. 5B shows a plasma generating apparatus including a chamber 11$b$, a stage 12$b$ and a heater 13$b$.

First, the epitaxial growth apparatus shown in FIG. 5A is used to grow a Si epitaxial layer having a thickness of 1 μm. In order to make the crystal defect in the Si epitaxial layer under 1 defect/cm$^2$, a hydrogen thermal process was carried out at 1 Torr and 1000° C. for 10 minutes. The flow rate of the hydrogen gas was set to 15 liters/minute.

Figure 5B:
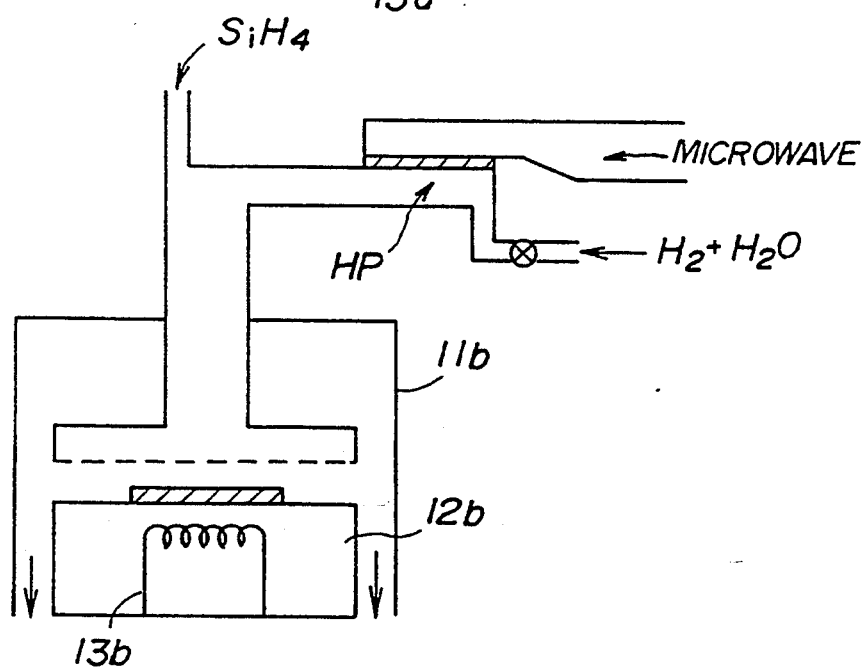

The plasma generating apparatus shown in FIG. 5B is connected to the epitaxial growth apparatus shown in FIG. 5A, and plasma of hydrogen was generated by setting the pressure to 1 Torr and the flow rate of the hydrogen gas to 500 cc/minute. A downstream pre-process was carried out using a gas which is dissociated by the generated plasma. The downstream pre-process of 30 minutes was required to make the crystal defect density to 1 defect/cm$^2$ or less. Next, when the flow rate of the hydrogen gas was set to 450 cc/minute and the flow rate of the water vapor was set to 50 cc/minute during the downstream pre-process, the crystal defect density became 1 defect/cm$^2$ or less in 10 minutes. In other words, the speed of the downstream pre-process was increased by reducing the flow rate of the hydrogen gas and adding a small quantity of water vapor to the hydrogen gas.

The detailed mechanisms of the present invention has not yet been elucidated. However, based on the experiments conducted by the present inventors, it may be regarded that the density of the hydrogen atoms increases because the dissociation of hydrogen molecules is accelerated when water vapor is added to the hydrogen gas during the hydrogen plasma process. In addition, it may be regarded that the density of the hydrogen atoms increases because the recombination of hydrogen atoms is suppressed by the addition of the water vapor. Normally, during the hydrogen plasma process, the recombination of the hydrogen atoms occurs mainly in the vicinity of the wall of the chamber. It was confirmed that, when the hydrogen plasma process is carried out using the hydrogen gas alone, the recombination of the hydrogen atoms is substantially the same even when the material used for the chamber wall is changed. But when the material used for the chamber wall is changed and the hydrogen plasma process is carried out using the hydrogen gas combined with water vapor, it was confirmed that the recombination of the hydrogen atoms changes depending on the chamber wall material. Hence, it was indirectly found that the recombination of hydrogen atoms is suppressed by the addition of the water vapor.

Figure 6:
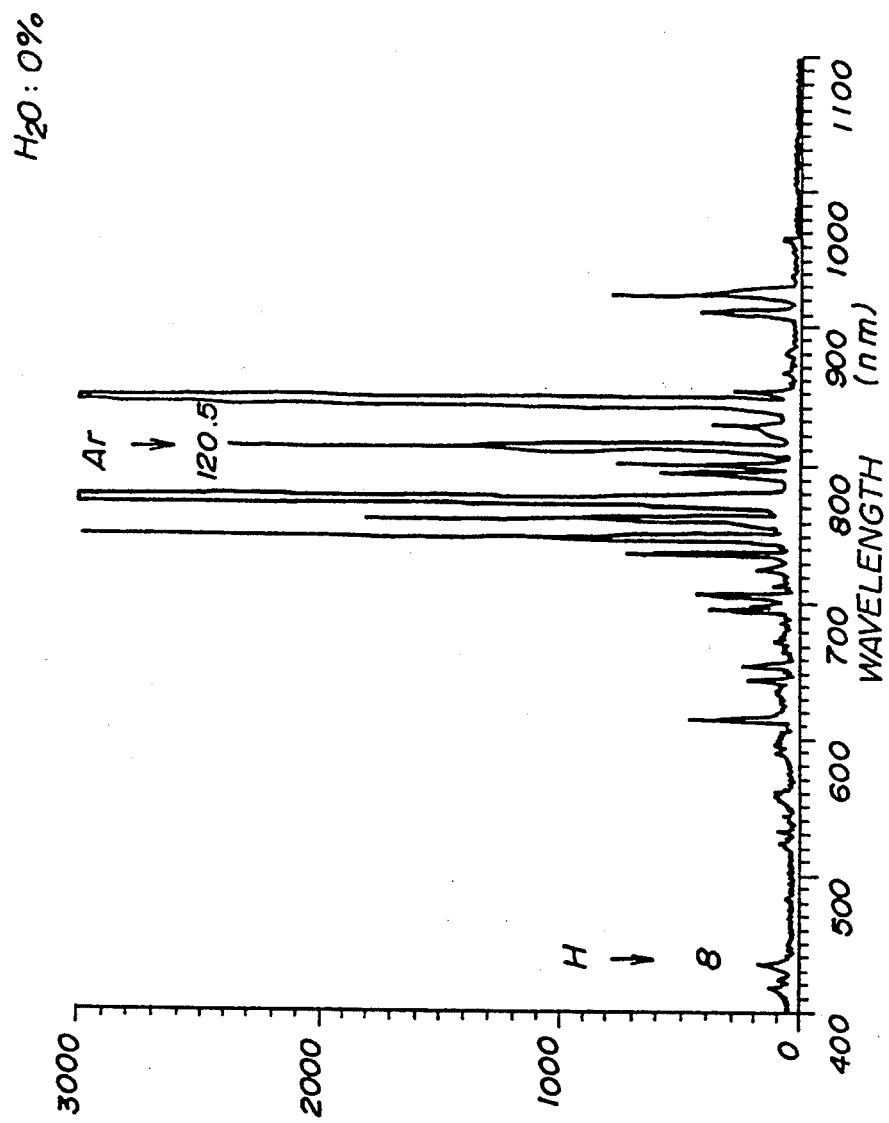
FIG. 6 shows the relative concentration of hydrogen atoms in the plasma when the hydrogen plasma process is carried out using only hydrogen gas.
Figure 7:
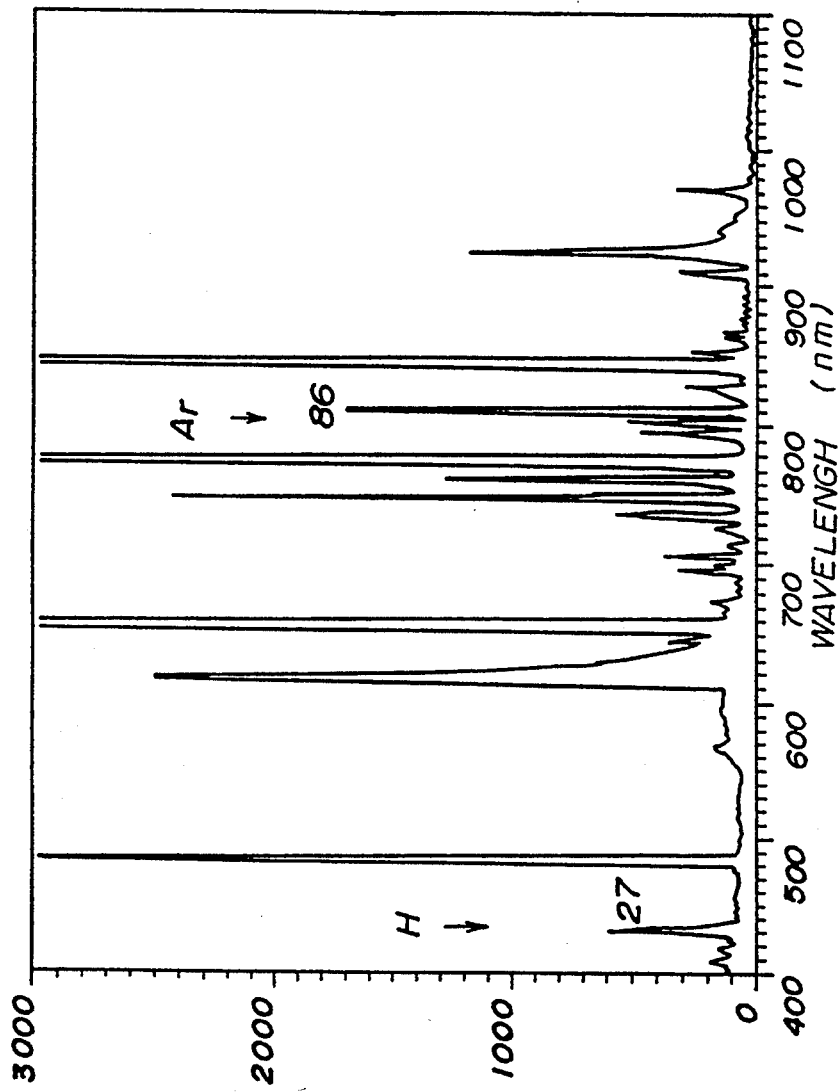
FIG. 7 shows the relative concentration of hydrogen atoms in the plasma when the hydrogen plasma process is carried out using hydrogen gas added with water vapor.

FIG. 6 shows the relative concentration of hydrogen atoms in the plasma (value of $I_H(4861Å)/I_{Ar}(8115Å)$) when the hydrogen plasma process is carried out using only hydrogen gas. In this case, the relative concentration of hydrogen atoms is 0.066. On the other hand, FIG. 7 shows the relative concentration of hydrogen atoms in the plasma (value of $I_H(4861Å)/I_{Ar}(8115Å)$) when the hydrogen plasma process is carried out using hydrogen gas added with water vapor. The ratio of the water vapor is 40%, and in this case, the relative concentration of hydrogen atoms is 0.314. In other words, when the hydrogen plasma process uses hydrogen gas added with water vapor as in FIG. 7, the relative concentration becomes approximately five times that of the case shown in FIG. 6. Hence, these experimental results support the above assumptions that the density of the hydrogen atoms increases when water vapor is added to the hydrogen gas during the hydrogen plasma process.

Figure 8:
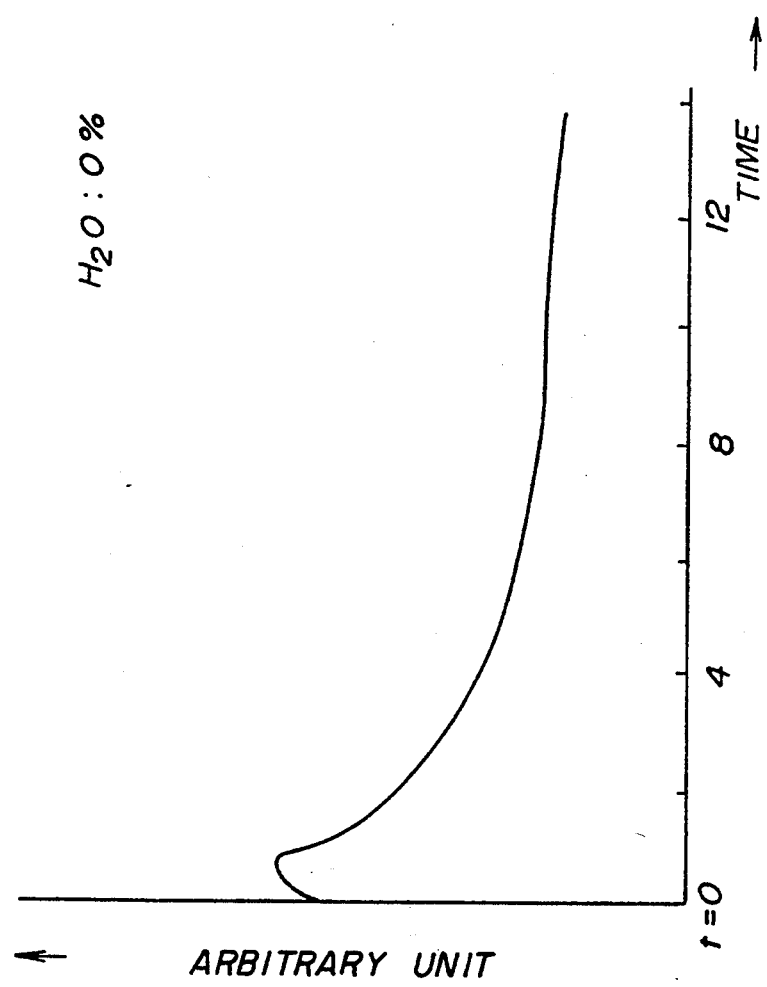
FIG. 8 shows the quantity change of hydrogen atoms with time when the hydrogen plasma process is carried out using only hydrogen gas.

FIG. 8 shows the change in the intensity of hydrogen atoms with time when the hydrogen plasma process is carried out using only hydrogen gas. On the other hand, FIG. 9 shows the change in the intensity of hydrogen atoms with time when the hydrogen plasma process is carried out using hydrogen gas added with water vapor. FIGS. 8 and 9 show the quantity of hydrogen atoms in a vicinity of a position HP in FIG. 5B when the plasma of hydrogen is generated using a microwave of 2.45 GHz with a power of 1.5 kW at a pressure of 1 Torr. Further, the values shown in FIGS. 8 and 9 are normalized and thus, the ordinates are in arbitrary units. FIG. 9 shows the case where the ratio of water vapor added to the hydrogen gas is 20%. As may be seen by comparing FIGS. 8 and 9, the quantity of hydrogen atoms decreases after generation of the plasma at a time t=0 in FIG. 8, but the quantity of hydrogen atoms remains substantially constant after generation of the plasma at the time t=0 in FIG. 9. As a result, these experimental results support the above assumptions that the recombination of hydrogen atoms is suppressed by the addition of the water vapor.

FIG. 10 shows the density of hydrogen atoms depending on the quantity of water vapor added to the hydrogen gas when carrying out the hydrogen plasma process. The data shown in FIG.10 were obtained at a pressure of 0.4 Torr using a microwave power of 500 W. As shown in FIG.10, this experimental result also shows that the density of hydrogen atoms increases when the ratio of water vapor added to the hydrogen gas during the hydrogen plasma process is greater than 0 and less than approximately 30%.

Therefore, according to the present invention, the hydrogen plasma process is carried out using a first gas which includes hydrogen molecules as the main component and a second gas which includes a quantity of hydrogen smaller than that included in the first gas. In the embodiments described above, the first gas is hydrogen gas itself and the second gas is water vapor. However, the first and second gasses are not limited to those of the embodiments. The second gas may be a gas of organic compounds including hydrogen and oxygen or inorganic compounds including hydrogen. In other words, the second gas may include a material selected from a group which includes alcohol, organic acid, phosphine ($PH_3$), arsine ($ASH_3$), borane ($BH_3$), diborane ($B_2H_6$), water vapor ($H_2O$), silane ($SiH_4$) and ammonia ($NH_3$). But the second gas is preferably water vapor ($H_2O$) since it is very easy to obtain and handle water, and further, because it is possible to prevent undesirable carbon deposits on the chamber wall, for example. Some materials when used as the second gas may cause undesirable deposits on the chamber wall.

In addition, the surface which is to be subjected to the plasma treating may be made of a material selected from a group including organic materials, semiconductors and metals. In the case of an organic material layer, this organic material layer before the plasma treating is subjected to an energy particle irradiation such as ion implantation, plasma and laser irradiation. The resist is a typical example of the organic material, and the resist layer before the plasma treating is preferably subjected to an ion implantation with a dosage of $1 \times 10^{14}$ atoms/$cm^2$ or greater and deteriorated. A semiconductor or metal layer may be subjected to the plasma treating immediately before another layer is formed on the semiconductor or metal layer. Si is a typical example of the semiconductor, and a Si substrate is subjected to the plasma treating before epitaxially growing a Si layer on the Si substrate, for example. Al is a typical example of the metal, and an Al layer is subjected to the plasma treating before forming another Al layer on the Al layer, for example.

Further, the present invention is not limited to these embodiments, but various variations and modifications may be made without departing from the scope of the present invention.

What is claimed is:

1. A plasma etching method for plasma etching a resist layer on a surface of an object within a chamber, said plasma etching method comprising:
   (a) coating the object surface with a resist layer;
   (b) supplying an etching gas consisting of first and second gasses into the chamber, said first gas consisting essentially of hydrogen gas, said second gas consisting essentially of a quantity of hydrogen less than that included in the first gas and being provided in the form of water vapor; and
   (c) irradiating said etching gas with microwaves to generate within the chamber a plasma of said etching gas so as to subject the resist layer on the object surface to the hydrogen plasma etching.

2. The plasma etching method as claimed in claim 1, wherein a ratio $H_2O/(H_2+H_2O)$ of hydrogen ($H_2$) and water vapor ($H_2O$) included in the mixed gas is greater than 0 but less than or equal to 30%.

3. The plasma etching method as claimed in claim 1, wherein said irradiating step is carried out at a pressure of 1 Torr or greater.

4. The plasma etching method as claimed in claim 1, wherein the object surface is made of a material selected from a group consisting of organic materials, semiconductors and metals.

5. The plasma etching method as claimed in claim 4, wherein the object surface is made of an irradiated organic material.

6. The plasma etching method as claimed in claim 4, wherein said irradiating step subjects the object surface which is made of either one of semiconductor and metal to the plasma etching to prepare the object surface for formation of a layer thereon.

7. The plasma etching method as claimed in claim 1, wherein the object is a silicon substrate.

8. The plasma etching method as claimed in claim 1, wherein the resist layer is a novolac resin system resist.

9. The plasma etching method as claimed in claim 3, wherein said irradiating step is carried out at a pressure of 1.8 Torr or greater.

10. The plasma etching method as claimed in claim 2, wherein the ratio $H_2O/(H_2+H_2O)$ of hydrogen ($H_2$) and water vapor ($H_2O$) included in the mixed gas is between approximately 10% and approximately 30%.

11. The plasma etching method as claimed in claim 10, wherein the ratio $H_2O/(H_2+H_2O)$ of hydrogen $H_2$ and water vapor ($H_2O$) included in the mixed gas is approximately 20%.

12. The plasma etching method as claimed in claim 10, wherein said etching gas consists solely of said hydrogen gas and water vapor.

* * * * *